(12) United States Patent  
Kwon et al.

(10) Patent No.: US 11,728,283 B2
(45) Date of Patent: Aug. 15, 2023

(54) PACKAGE SUBSTRATE AND SEMICONDUCTOR PACKAGE INCLUDING THE SAME

(71) Applicant: Samsung Electronics Co., Ltd., Suwon-si (KR)

(72) Inventors: Chilwoo Kwon, Suwon-si (KR); Jeongseok Kim, Cheonan-si (KR); Junggon Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 17/183,513

(22) Filed: Feb. 24, 2021

(65) Prior Publication Data

US 2022/0045017 A1  Feb. 10, 2022

(30) Foreign Application Priority Data

Aug. 10, 2020 (KR) .......................... 10-2020-0099633

(51) Int. Cl.
*H01L 23/00* (2006.01)
*H01L 25/10* (2006.01)
(Continued)

(52) U.S. Cl.
CPC ........ *H01L 23/562* (2013.01); *H01L 23/3128* (2013.01); *H01L 23/5383* (2013.01);
(Continued)

(58) Field of Classification Search
CPC ............... H01L 23/562; H01L 23/3128; H01L 23/5383; H01L 23/5386; H01L 23/5389;
(Continued)

(56) References Cited

U.S. PATENT DOCUMENTS

| 6,674,174 B2 | 1/2004 | Chungpaiboonpatana et al. |
| 6,845,198 B2 | 1/2005 | Montgomery et al. |

(Continued)

FOREIGN PATENT DOCUMENTS

| CN | 1764863 A | 4/2006 |
| JP | 2002286786 A | 10/2002 |

(Continued)

*Primary Examiner* — Kyoung Lee
*Assistant Examiner* — Christina A Sylvia
(74) *Attorney, Agent, or Firm* — Muir Patent Law, PLLC

(57) ABSTRACT

A package substrate may include a plurality of stacked insulation layers, a plurality of RDLs and a pair of impedance patterns. The RDLs may be arranged between the insulation layers. The impedance patterns may be arranged on an upper surface of at least one of the insulation layers. The impedance patterns may have an insulation length corresponding to a summed length of thicknesses of at least two insulation layers among the plurality of the insulation layers. Thus, a dummy conductive pattern may not be arranged between the impedance patterns and the RDL so that only the insulation layer may exist between the impedance patterns and the RDL. As a result, the insulation length of the impedance patterns may correspond to the summed length of the thicknesses of the at least two insulation layers.

18 Claims, 15 Drawing Sheets

(51) Int. Cl.
  *H01L 23/31* (2006.01)
  *H01L 23/538* (2006.01)
  *H01L 23/64* (2006.01)

(52) U.S. Cl.
  CPC ...... *H01L 23/5386* (2013.01); *H01L 23/5389* (2013.01); *H01L 23/64* (2013.01); *H01L 24/20* (2013.01); *H01L 25/105* (2013.01); *H01L 2224/214* (2013.01); H01L 2225/1035 (2013.01); *H01L 2225/1058* (2013.01); *H01L 2924/30111* (2013.01); *H01L 2924/3511* (2013.01)

(58) Field of Classification Search
  CPC . H01L 23/64; H01L 23/645; H01L 23/49816; H01L 23/525; H01L 23/485; H01L 23/528; H01L 24/20; H01L 25/105; H01L 25/0657; H01L 2224/214; H01L 2224/32225; H01L 2224/0401; H01L 2224/04042; H01L 2224/04105; H01L 2224/12105; H01L 2224/16227; H01L 2224/48227; H01L 2224/73204; H01L 2224/92125; H01L 2225/1035; H01L 2225/1058; H01L 2225/1041; H01L 2924/30111; H01L 2924/3511; H01L 2924/15311

See application file for complete search history.

(56) References Cited

U.S. PATENT DOCUMENTS

| | | | |
|---|---|---|---|
| 7,088,200 B2 | 8/2006 | Bartley et al. | |
| 7,132,740 B2 | 11/2006 | Lamson et al. | |
| 7,448,880 B2 | 11/2008 | Osaka | |
| 9,496,594 B2 | 11/2016 | Park et al. | |
| 2017/0064837 A1* | 3/2017 | Li | H01L 23/64 |
| 2019/0318990 A1* | 10/2019 | Nakagawa | H01L 24/17 |
| 2020/0075553 A1* | 3/2020 | Delacruz | H01L 23/552 |

FOREIGN PATENT DOCUMENTS

| | | |
|---|---|---|
| JP | 2006041318 A | 2/2006 |
| JP | 2007305648 A | 11/2007 |
| JP | 5235628 B2 | 7/2013 |
| JP | 6080729 B2 | 2/2017 |

\* cited by examiner

PACKAGE SUBSTRATE AND SEMICONDUCTOR PACKAGE INCLUDING THE SAME

CROSS-RELATED APPLICATION

This application claims priority under 35 U.S.C. § 119 to Korean Patent Application No. 10-2020-0099633, filed on Aug. 10, 2020, in the Korean Intellectual Property Office (KIPO), the contents of which are herein incorporated by reference in their entirety.

BACKGROUND

1. Field

Example embodiments relate to a package substrate and a semiconductor package including the same. More particularly, example embodiments relate to a package substrate including impedance patterns and a semiconductor package including the package substrate.

2. Description of the Related Art

Generally, a fan-out type semiconductor package may include a frame having a cavity, a semiconductor chip arranged in the cavity, a package substrate arranged on a lower surface of the frame, and external terminals mounted on a lower surface of the package substrate. The package substrate may include a plurality of insulation layers, redistribution layers interposed between the insulation layers and a pair of impedance patterns in the insulation layers.

According to related arts, for impedance matching between the redistribution layers, a dummy conductive pattern may be arranged between the impedance patterns and any one of the redistribution layers. Because the dummy conductive pattern may be positioned in any one of the insulation layers, decreasing a thickness of the insulation layer, i.e., a thickness of the package substrate may be restricted. Further, the insulation layer may have a large size due to the dummy conductive pattern for warpage control of the package substrate caused by a difference of thermal expansion coefficients between the insulation layer and the redistribution layer.

SUMMARY

Example embodiments provide a package substrate having a thin thickness that may be capable of readily controlling a warpage of the package substrate.

Example embodiments also provide a semiconductor package including the above-mentioned package substrate.

According to example embodiments, there may be provided a semiconductor package. The semiconductor package may include a package substrate, a semiconductor chip, a molding member and external terminals. The package substrate may include a first insulation layer, first redistribution layers (RDL), a second insulation layer, second RDLs, a third insulation layer, third RDLs, a pair of impedance patterns and a fourth insulation layer. The first insulation layer may have a plurality of first via holes. The first RDLs may be arranged on an upper surface of the first insulation layer to fill the first via holes. The second insulation layer may be arranged on the upper surface of the first insulation layer. The second insulation layer may have a plurality of second via holes configured to expose the first RDLs. The second RDLs may be arranged on an upper surface of the second insulation layer to fill the second via holes. The second RDLs may be electrically connected with the first RDLs. The third insulation layer may be arranged on the upper surface of the second insulation layer. The third insulation layer may have a plurality of third via holes configured to expose the second RDLs. The third RDLs may be arranged on an upper surface of the third insulation layer to fill the third via holes. The third RDLs may be electrically connected with the second RDLs. The pair of impedance patterns may be arranged on the upper surface of the third insulation layer over the second RDLs. The pair of impedance patterns may have an insulation length corresponding to a summed length of a thickness of the second insulation layer and a thickness of the third insulation layer. The fourth insulation layer may be arranged on the upper surface of the third insulation layer to surround the third RDLs and the pair of impedance patterns. The semiconductor chip may be arranged on the upper surface of the package substrate. The semiconductor chip may be electrically connected with the third RDLs. The molding member may be arranged on the upper surface of the package substrate to surround the semiconductor chip. The external terminals may be arranged on a lower surface of the package substrate. The external terminals may be electrically connected with the first RDLs.

According to example embodiments, there may be provided a package substrate. The package substrate may include a first insulation layer, first RDLs, a second insulation layer, second RDLs, a third insulation layer, third RDLs, a pair of impedance patterns and a fourth insulation layer. The first insulation layer may have a plurality of first via holes. The first RDLs may be arranged on an upper surface of the first insulation layer to fill the first via holes. The second insulation layer may be arranged on the upper surface of the first insulation layer. The second insulation layer may have a plurality of second via holes configured to expose the first RDLs. The second RDLs may be arranged on an upper surface of the second insulation layer to fill the second via holes. The second RDLs may be electrically connected with the first RDLs. The third insulation layer may be arranged on the upper surface of the second insulation layer. The third insulation layer may have a plurality of third via holes configured to expose the second RDLs. The third RDLs may be arranged on an upper surface of the third insulation layer to fill the third via holes. The third RDLs may be electrically connected with the second RDLs. The pair of impedance patterns may be arranged on the upper surface of the third insulation layer over the second RDLs. The impedance patterns may be positioned in at least one level. The pair of impedance patterns may have an insulation length corresponding to a summed length of a thickness of the second insulation layer and a thickness of the third insulation layer. The fourth insulation layer may be arranged on the upper surface of the third insulation layer to surround the third RDLs and the pair of impedance patterns.

According to example embodiments, there may be provided a package substrate. The package substrate may include a plurality of stacked insulation layers, a plurality of RDLs, and a pair of impedance patterns. The RDLs may be arranged between the insulation layers. The pair of impedance patterns may be arranged on an upper surface of at least one of the insulation layers. The pair of impedance patterns may have an insulation length corresponding to a summed length of thicknesses of at least two insulation layers among the plurality of the insulation layers.

According to example embodiments, a dummy conductive pattern may not be arranged between the impedance patterns and the RDL. Thus, only the insulation layer may exist between the impedance patterns and the RDL. Therefore, the insulation length of the impedance patterns may correspond to the summed length of the thicknesses of the at least two insulation layers. As a result, the package substrate may have a thin thickness by decreasing the thickness of the insulation layer. Further, the warpage of the package may be readily controlled by decreasing the thickness of the insulation layer.

BRIEF DESCRIPTION OF THE DRAWINGS

Example embodiments will be more clearly understood from the following detailed description taken in conjunction with the accompanying drawings.

FIG. 1 is a cross-sectional view illustrating a package substrate in accordance with example embodiments;

FIG. 2 is an enlarged cross-sectional view of a portion "A" in FIG. 1;

FIG. 3 is a cross-sectional view illustrating a package substrate in accordance with example embodiments;

FIG. 4 is an enlarged cross-sectional view of a portion "B" in FIG. 3;

FIG. 5 is a cross-sectional view illustrating a package substrate in accordance with example embodiments;

FIG. 6 is an enlarged cross-sectional view of a portion "C" in FIG. 5;

FIG. 7 is a cross-sectional view illustrating a package substrate in accordance with example embodiments;

FIG. 8 is an enlarged cross-sectional view of a portion "D" in FIG. 7;

FIG. 9 is a cross-sectional view illustrating a package substrate in accordance with example embodiments;

FIG. 10 is an enlarged cross-sectional view of a portion "E" in FIG. 9;

FIG. 11 is a cross-sectional view illustrating a semiconductor package in accordance with example embodiments;

FIG. 12 is a cross-sectional view illustrating a semiconductor package in accordance with example embodiments;

FIG. 13 is a cross-sectional view illustrating a fan-out type semiconductor package in accordance with example embodiments;

FIG. 14 is a cross-sectional view illustrating a semiconductor package in accordance with example embodiments; and FIG. 15 is a cross-sectional view illustrating a semiconductor package in accordance with example embodiments.

DETAILED DESCRIPTION OF THE EMBODIMENTS

Figure 1:
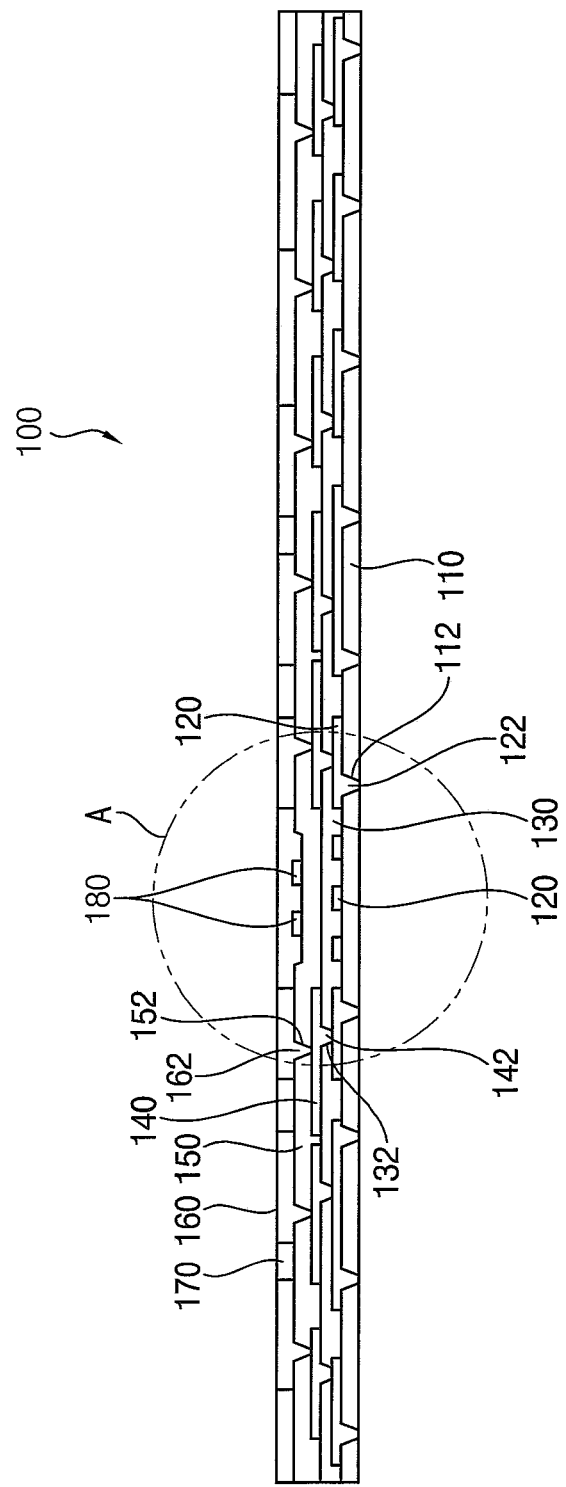
FIGS. 1 to 15 represent non-limiting, example embodiments as described herein.

Hereinafter, example embodiments will be explained in detail with reference to the accompanying drawings. In the drawings, like numeral refer to like elements throughout.

Figure 2:
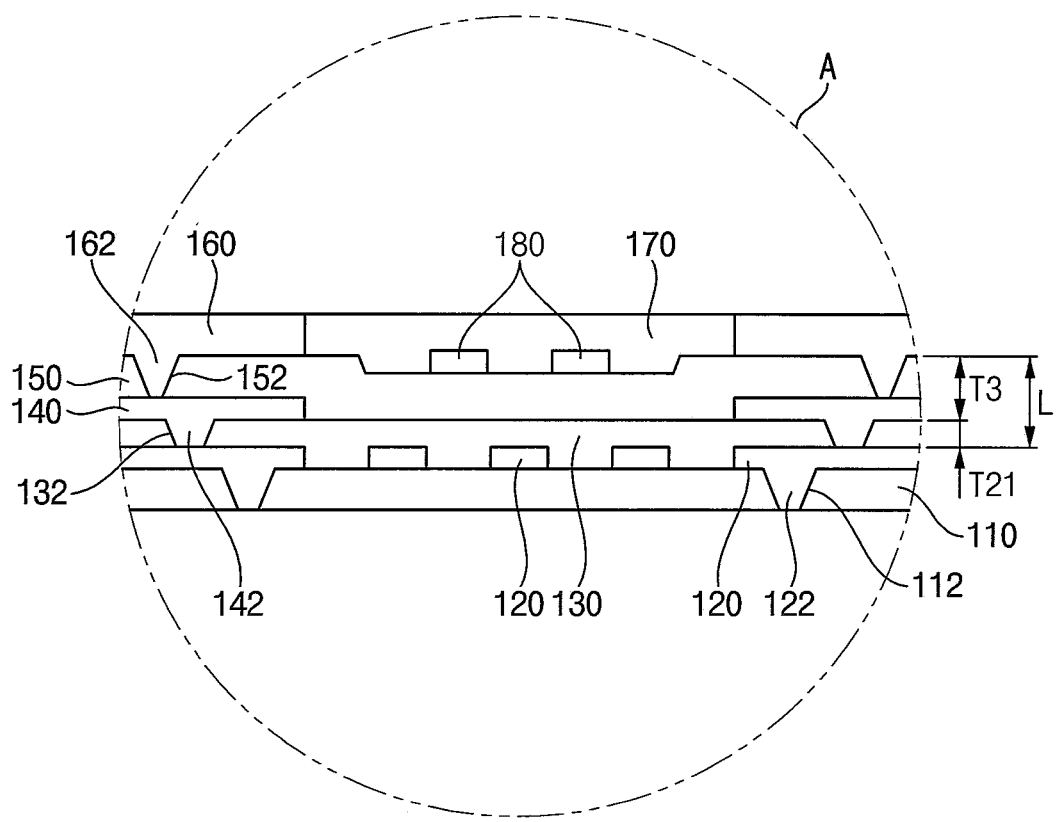

FIG. 1 is a cross-sectional view illustrating a package substrate in accordance with example embodiments, and FIG. 2 is an enlarged cross-sectional view of a portion "A" in FIG. 1.

Referring to FIGS. 1 and 2, a package substrate 100 of example embodiments may include a first insulation layer 110, first redistribution layers (RDL) 120, a second insulation layer 130, second RDLs 140, a third insulation layer 150, third RDLs 160, a fourth insulation layer 170, and a pair of impedance patterns 180.

In example embodiments, the first insulation layer 110, the second insulation layer 130, the third insulation layer 150, and the fourth insulation layer 170 may include photo imagable dielectrics (PID). Alternatively, the first insulation layer 110, the second insulation layer 130, the third insulation layer 150, and the fourth insulation layer 170 may include other insulation materials besides the PID. The first insulation layer 110, the second insulation layer 130, the third insulation layer 150, and the fourth insulation layer 170 may have substantially the same thickness or different thicknesses. Thickness may refer to the thickness or height measured in a direction perpendicular to a top surface of the substrate 100.

The first RDLs 120, the second RDLs 140, and the third RDLs 160 may include metals such as copper, aluminum, etc. However, the material of the first RDLs 120, the second RDLs 140, and the third RDLs 160 may not be restricted within a specific conductive material. Further, the first RDLs 120, the second RDLs 140, and the third RDLs 160 may have substantially the same thickness or different thicknesses.

Alternatively, the package substrate 100 may include stacked three or at least five insulation layers and RDLs interposed between the stacked insulation layers.

The first insulation layer 110 may include a plurality of first via holes 112. The first via holes 112 may be vertically formed through the first insulation layer 110. A lower solder resist pattern may be formed on a lower surface of the first insulation layer 110. External terminals may be mounted on the lower surface of the first insulation layer 110.

The first RDLs 120 may be arranged on an upper surface of the first insulation layer 110. Bottom surfaces of the first RDLs 120 may contact the upper surface of the first insulation layer 110. The first RDLs 120 may include first via contacts 122 configured to fill the first via holes 112. The first RDLs 120 and the first via contacts 122 may be formed by forming a conductive layer on the upper surface of the first insulation layer 110 and inner surfaces of the first via holes 112 by a plating process, and by patterning the conductive layer. The first via contacts 122 may be exposed through openings of the lower resist pattern. The external terminals may be electrically connected to the first via contacts 122.

The second insulation layer 130 may be arranged on the upper surface of the first insulation layer 110. A lower surface of the second insulation layer 130 may contact the upper surface of the first insulation layer 110 and upper surfaces of the first RDLs 120. The second insulation layer 130 may include a plurality of second via holes 132. The second via holes 132 may be vertically formed through the second insulation layer 130 to partially expose the first RDLs 120.

The second RDLs 140 may be arranged on an upper surface of the second insulation layer 130. Bottom surfaces of the second RDLs 140 may contact the upper surface of the second insulation layer 130. The second RDLs 140 may include second via contacts 142 configured to fill the second via holes 132. The second RDLs 140 and the second via contacts 142 may be formed by forming a conductive layer on the upper surface of the second insulation layer 130 and inner surfaces of the second via holes 132 by a plating process, and by patterning the conductive layer. The second via contacts 142 may contact the upper surface of the first RDLs 120. Thus, the first RDLs 120 and the second RDLs 140 may be electrically connected with each other through the second via contacts 142.

The third insulation layer 150 may be arranged on the upper surface of the second insulation layer 130. A lower surface of the third insulation layer 150 may contact the upper surface of the second insulation layer 130 and upper surfaces of the second RDLs 140. The third insulation layer 150 may include a plurality of third via holes 152. The third via holes 152 may be vertically formed through the third insulation layer 150 to partially expose the second RDLs 140.

The third RDLs 160 may be arranged on an upper surface of the third insulation layer 150. Bottom surfaces of the third RDLs 160 may contact the upper surface of the third insulation layer 150. The third RDLs 160 may include third via contacts 162 configured to fill the third via holes 152. The third RDLs 160 and the third via contacts 162 may be formed by forming a conductive layer on the upper surface of the third insulation layer 150 and inner surfaces of the third via holes 152 by a plating process, and by patterning the conductive layer. The third via contacts 162 may contact the upper surface of the second RDLs 140. Thus, the second RDLs 140 and the third RDLs 160 may be electrically connected with each other through the third via contacts 162.

The pair of impedance patterns 180 may be arranged on the upper surface of the third insulation layer 150. Bottom surfaces of the pair of impedance patterns 180 may contact the upper surface of the third insulation layer 150. Particularly, the impedance patterns 180 may be positioned between the third RDLs 160. For example, the impedance patterns 180 may horizontally overlap the third RDLs 160. Further, the impedance patterns 180 may be located higher than and between the second RDLs 140. The impedance patterns 180 may be formed together with the third RDLs 160. For example, the impedance patterns 180 may be a part of the third RDLs 160. Upper surfaces of the impedance patterns 180 and the third RDLs 160 may be coplanar. The impedance patterns 180 may be positioned in one level or at least two levels.

The fourth insulation layer 170 may be arranged on the upper surface of the third insulation layer 150. A bottom surface of the fourth insulation layer 170 may contact the upper surface of the third insulation layer 150. The fourth insulation layer 170 may be configured to surround side surfaces of the third RDLs 160 and the impedance patterns 180. For example, the fourth insulation layer 170 may contact side surfaces of the third RDLs 160 and the impedance patterns 180. The upper surface of the third RDLs 160 may be upwardly exposed by the fourth insulation layer 170. The upper surfaces of the third RDLs 16) may be coplanar with the upper surface of the fourth insulation layer 170.

As used herein, the terms "contact" or "in contact with" refer to a direct connection (i.e., touching) unless the context indicates otherwise. Terms such as "same," "equal," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially coplanar." may be exactly the same, equal, or planar, or may be the same, equal, or coplanar within acceptable variations that may occur, for example, due to manufacturing processes.

In example embodiments, a dummy conductive pattern, which may be to be arranged on a level on which the second RDLs 140 may be arranged, may not be arranged under the impedance patterns 180. Thus, only the second insulation layer 130 and the third insulation layer 150 may exist between the impedance patterns 180 and the first RDLs 120. For example, according to conventional arts, the dummy conductive pattern may be arranged between the impedance patterns 180 and the first RDLs 120. In contrast, according to example embodiments, any conductive structure such as the dummy conductive pattern may not be arranged between the impedance patterns 180 and the first RDLs 120. Thus, the insulation material of the second and third insulation layers 130 and 150 may exist between the impedance patterns 180 and the first RDLs 120.

As mentioned above, because the second insulation layer 130 and the third insulation layer 150 may exist between the impedance patterns 180 and the first RDLs 120, an insulation length L of the impedance patterns 180 may correspond to a distance between the impedance patterns 180 and the first RDLs 120. For example, an insulation length of the conventional impedance patterns may correspond to a distance between the impedance patterns and the dummy conductive pattern. In contrast, because the dummy conductive pattern may not be arranged between the impedance patterns 180 and the first RDLs 120 in accordance with example embodiments, the insulation length L of the impedance patterns 180 may be a summed length of a partial thickness T21 of the second insulation layer 130 and a thickness T3 of the third insulation layer 150. The first RDL 120 may be positioned on the upper surface of the first insulation layer 110 so that the partial thickness T21 of the second insulation layer 130 may be a value by subtracting a thickness of the first RDL 120 from a total thickness T2 of the second insulation layer 130. For example, when the second insulation layer 130 and the third insulation layer 150 may have a same thickness, the insulation length L of the impedance patterns 180 may be about two times the thickness of the second insulation layer 130 or the third insulation layer 150. Particularly, when the thickness of the second insulation layer 130 or the third insulation layer 150 may be about 5 µm to about 10 µm, the insulation length L of the impedance patterns 180 may be about 10 µm to about 20 µm. Therefore, when the package substrate 100 may include no less than five insulation layers, the insulation length L of the impedance patterns 180 may be about three times the thickness of any one of the insulation layers.

Further, because the dummy conductive pattern may not be arranged on the upper surface of the second insulation layer 130, a portion of the third insulation layer 150 over the second insulation layer 130 without the dummy conductive pattern. i.e., under the impedance patterns 180 may be positioned slightly under a portion of the third insulation layer 150 over the second RDL 140. For example, when the third insulation layer 150 has a uniform thickness, the third insulation layer 150 may have a curved shape including a slightly downward deflection of the portion of the third insulation layer 150 under the impedance patterns 180.

Therefore, the impedance patterns 180 arranged on the downward deflection of the third insulation layer 150 may also be positioned slightly under the third RDL 160. For example, the impedance patterns 180 may be positioned on a horizontal plane lower than a horizontal plane on which the third RDL 160 may be positioned. Particularly, when the impedance patterns 180 have a thickness substantially the same as the thickness of the third RDL 160, the impedance patterns 180 may have a lower surface lower than a lower surface of the third RDL 160, and an upper surface lower than an upper surface of the third RDL 160. Thus, when the fourth insulation layer 170 has a uniform thickness, the fourth insulation layer 170 may be configured to cover upper surfaces of the impedance patterns 180.

According to example embodiments, the insulation length L of the impedance patterns 180 on the upper surface of the third insulation layer 150 may be a summed length of the partial thickness T21 of the second insulation layer 130 and the thickness T3 of the third insulation layer 150. Thus, the thicknesses of the insulation layers may be reduced to provide the package substrate 100 with a thin thickness. Further, a warpage of the package substrate 100 may be readily controlled by reducing the thickness of the insulation layer.

Figure 3:
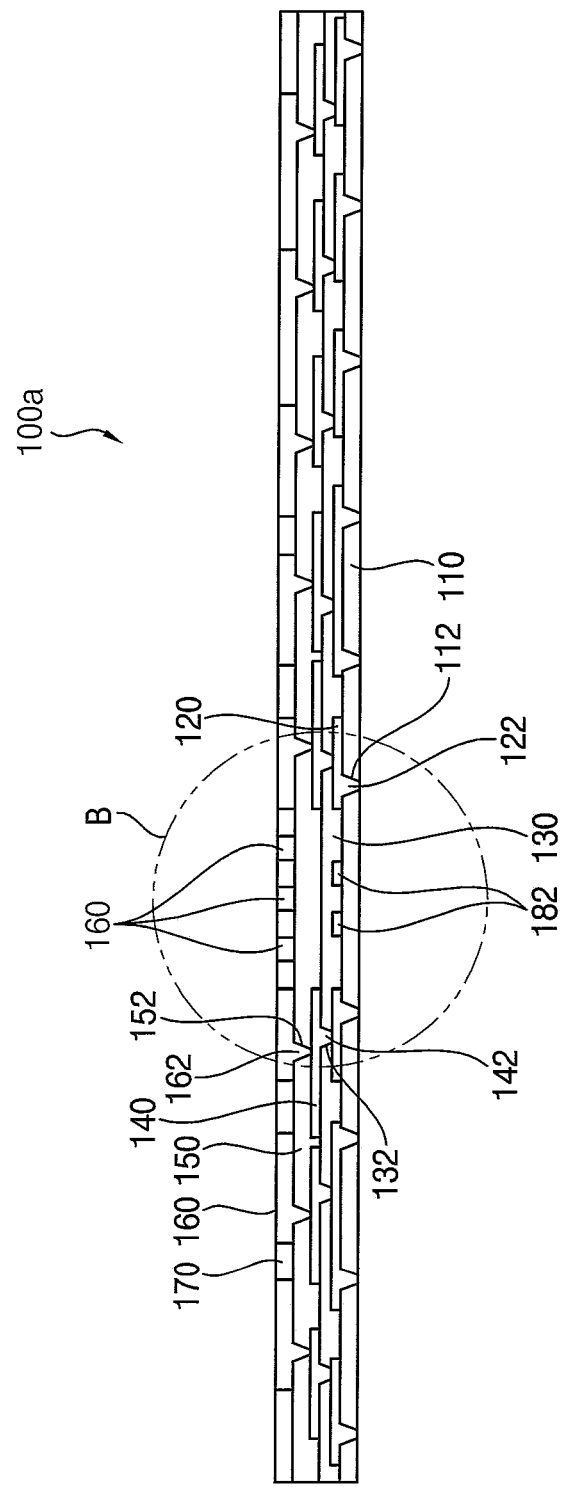
Figure 4:
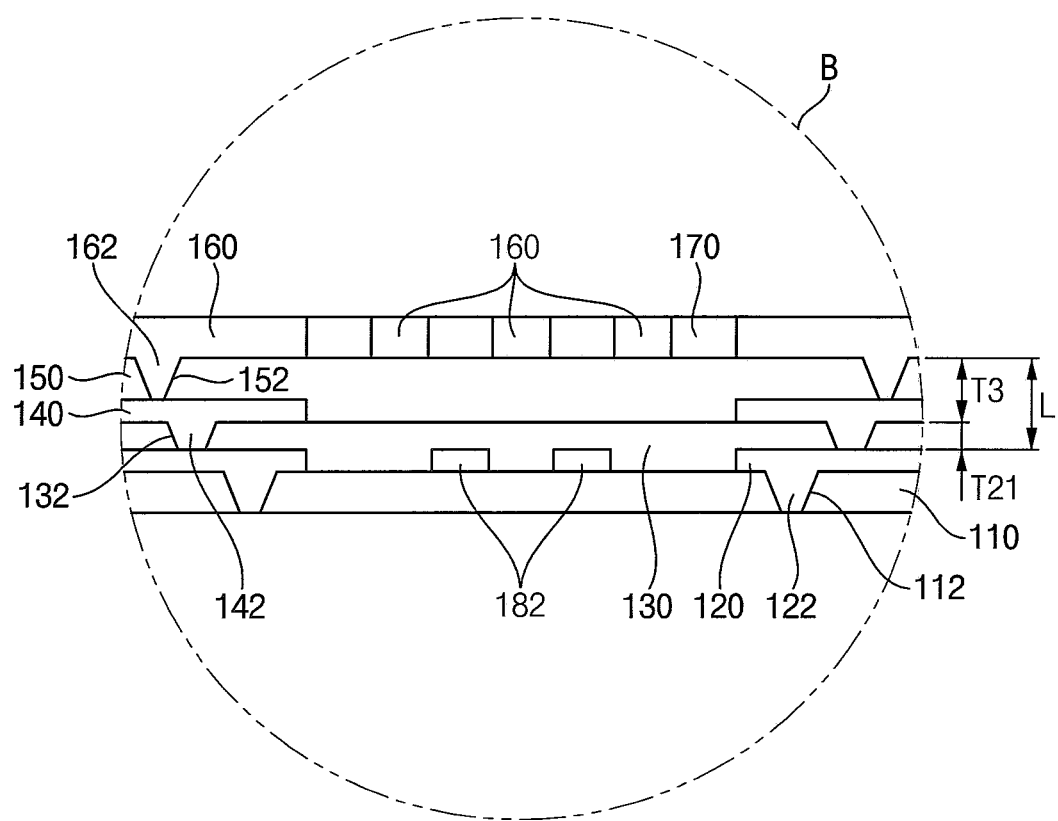

FIG. 3 is a cross-sectional view illustrating a package substrate in accordance with example embodiments, and FIG. 4 is an enlarged cross-sectional view of a portion "B" in FIG. 3.

A package substrate 100a of this example embodiment may include elements substantially the same as those of the package substrate 100 in FIG. 1 except for a position of impedance patterns. Thus, the same reference numerals may refer to the same elements and any further illustrations with respect to the same elements may be omitted herein for brevity.

Referring to FIGS. 3 and 4, a pair of impedance patterns 182 may be arranged on the upper surface of the first insulation layer 110. Bottom surfaces of the pair of impedance patterns 182 may contact the upper surface of the first insulation layer 110. Particularly, the impedance patterns 182 may be positioned between the first RDLs 120. For example, the impedance patterns 182 may horizontally overlap the first RDLs 120. Further, the impedance patterns 182 may be located at a level lower than and between the second RDLs 140. The impedance patterns 182 may be formed together with the first RDLs 120. For example, the impedance patterns 182 may be a part of the first RDLs 120. The impedance patterns 182 may be positioned in one level or at least two levels.

In example embodiments, a dummy conductive pattern, which may be arranged on a level on which the second RDLs 140 may be arranged, may not be arranged over the impedance patterns 182. Thus, only the second insulation layer 130 and only the third insulation layer 150 may exist between the impedance patterns 182 and the third RDLs 160. As mentioned above, because the second insulation layer 130 and the third insulation layer 150 may exist between the impedance patterns 182 and the third RDLs 160, an insulation length L of the impedance patterns 182 may correspond to a distance between the impedance patterns 182 and the third RDLs 160. Thus, the insulation length L of the impedance patterns 182 may be a summed length of the partial thickness T21 of the second insulation layer 130 and the thickness T3 of the third insulation layer 150. For example, when the second insulation layer 130 and the third insulation layer 150 have a same thickness, the insulation length L of the impedance patterns 182 may be about two times the thickness of the second insulation layer 130 or the third insulation layer 150. Particularly, when the thickness of the second insulation layer 130 or the third insulation layer 150 is about 5 μm to about 10 μm, the insulation length L of the impedance patterns 182 may be about 10 μm to about 20 μm.

According to example embodiments, the insulation length L of the impedance patterns 182 on the upper surface of the first insulation layer 110 may be a summed length of the partial thickness T21 of the second insulation layer 130 and the thickness T3 of the third insulation layer 150. Thus, the thicknesses of the insulation layers may be reduced to provide the package substrate 100a with a thin thickness. Further, a warpage of the package substrate 100a may be readily controlled by reducing the thickness of the insulation layer.

Figure 5:
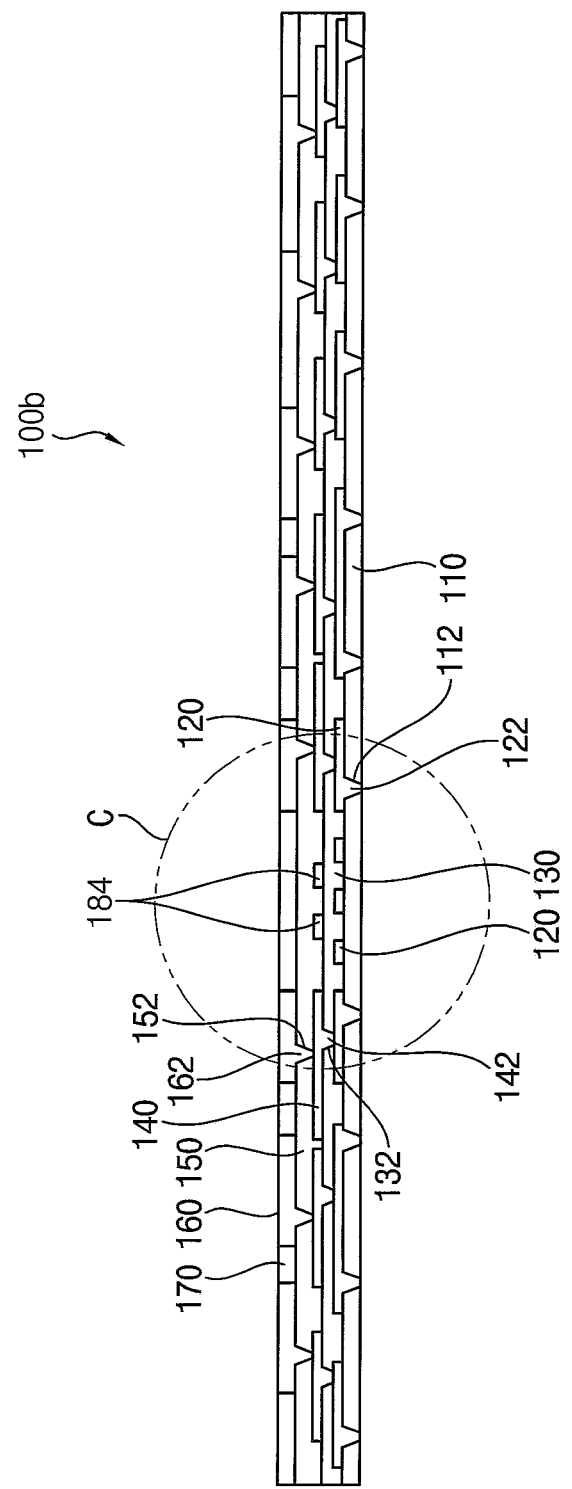
Figure 6:
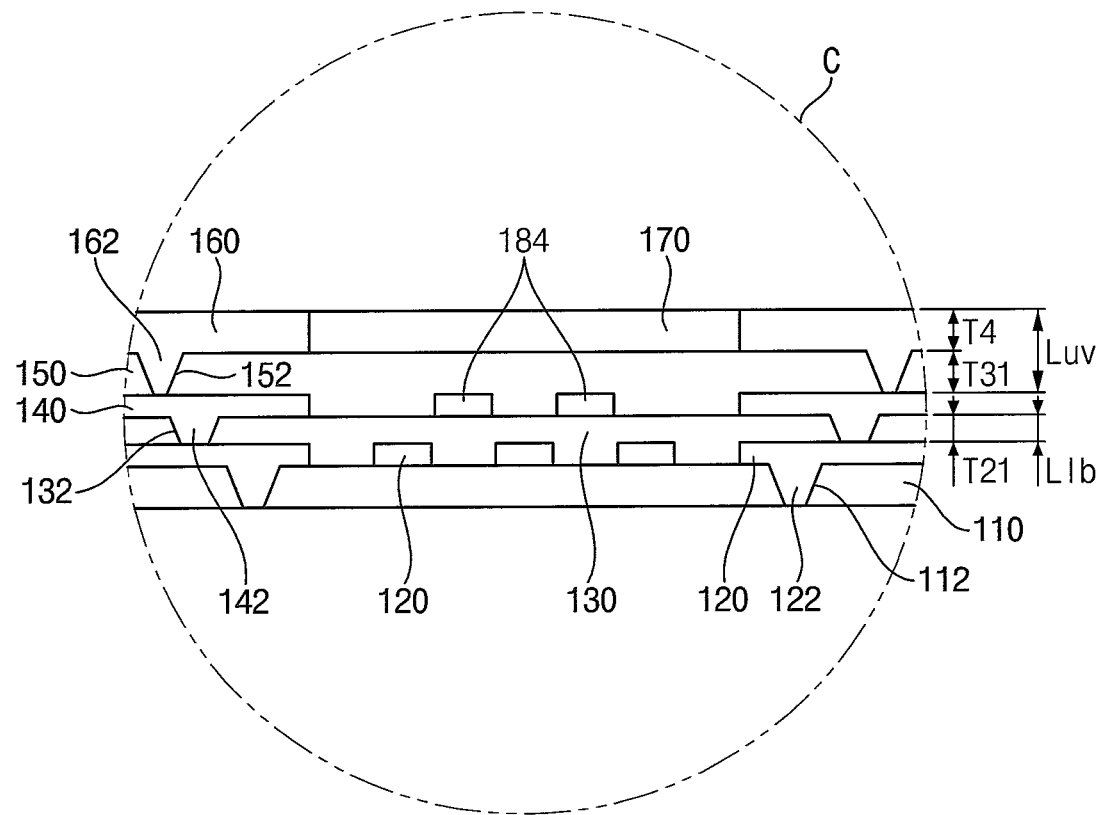

FIG. 5 is a cross-sectional view illustrating a package substrate in accordance with example embodiments, and FIG. 6 is an enlarged cross-sectional view of a portion "C" in FIG. 5.

A package substrate 100b of this example embodiment may include elements substantially the same as those of the package substrate 100X in FIG. 1 except for a position of impedance patterns. Thus, the same reference numerals may refer to the same elements and any further illustrations with respect to the same elements may be omitted herein for brevity.

Referring to FIGS. 5 and 6, a pair of impedance patterns 184 may be arranged on the upper surface of the second insulation layer 130. The pair of impedance patterns 184 may contact the upper surface of the second insulation layer 130. Particularly, the impedance patterns 184 may be positioned between the second RDLs 140. For example, the pair of impedance patterns 184 may horizontally overlap the second RDLs 140. The impedance patterns 184 may be formed together with the second RDLs 140. For example, the impedance patterns 184 may be a part of the second RDLs 140. Upper surfaces of the impedance patterns 184 and the second RDLs 140 may be coplanar. The impedance patterns 184 may be positioned in one level or at least two levels.

In example embodiments, a dummy conductive pattern, which may be to be arranged on a level on which the third RDLs 160 may be arranged, may not be arranged over the impedance patterns 184. Thus, only the third insulation layer 150 and the fourth insulation layer 170 may exist over the impedance patterns 184. For example, only the third insulation layer 150 and the fourth insulation layer 170 may vertically overlap the impedance patterns 184. As mentioned above, because the third insulation layer 150 and the fourth insulation layer 170 may exist over the impedance patterns 184, an upper insulation length Lub of the impedance patterns 184 may be a summed length of the partial thickness T31 of the third insulation layer 150 and the thickness T4 of the fourth insulation layer 170. The impedance patterns 184 may be positioned on the upper surface of the second insulation layer 130 so that the partial thickness T31 of the third insulation layer 150 may be a value by subtracting a thickness of the impedance pattern 184 from a total thickness T3 of the third insulation layer 150. For example, when the third insulation layer 150 and the fourth insulation layer 170 may have a same thickness, the upper insulation length Lub of the impedance patterns 184 may be about two times the thickness of the third insulation layer 150 or the fourth insulation layer 170. Particularly, when the thickness of the third insulation layer 150 or the fourth insulation layer 170 may be about 5 μm to about 10 μm, the upper insulation length Lub of the impedance patterns 184 may be about 10 μm to about 20 μm.

In contrast, a dummy conductive pattern as a part of the first RDLs 120 may be arranged under the impedance patterns 184. Thus, a lower insulation length L1b of the impedance patterns 184 may be about the partial thickness T21 of the second insulation layer 130.

According to example embodiments, the upper insulation length Lub of the impedance patterns 184 on the upper surface of the second insulation layer 130 may be a summed length of the partial thickness T31 of the third insulation layer 150 and the thickness T4 of the fourth insulation layer 160. Thus, the thicknesses of the insulation layers may be reduced to provide the package substrate 100b with a thin thickness. Further, a warpage of the package substrate 100b may be readily controlled by reducing the thickness of the insulation layer.

Figure 7:
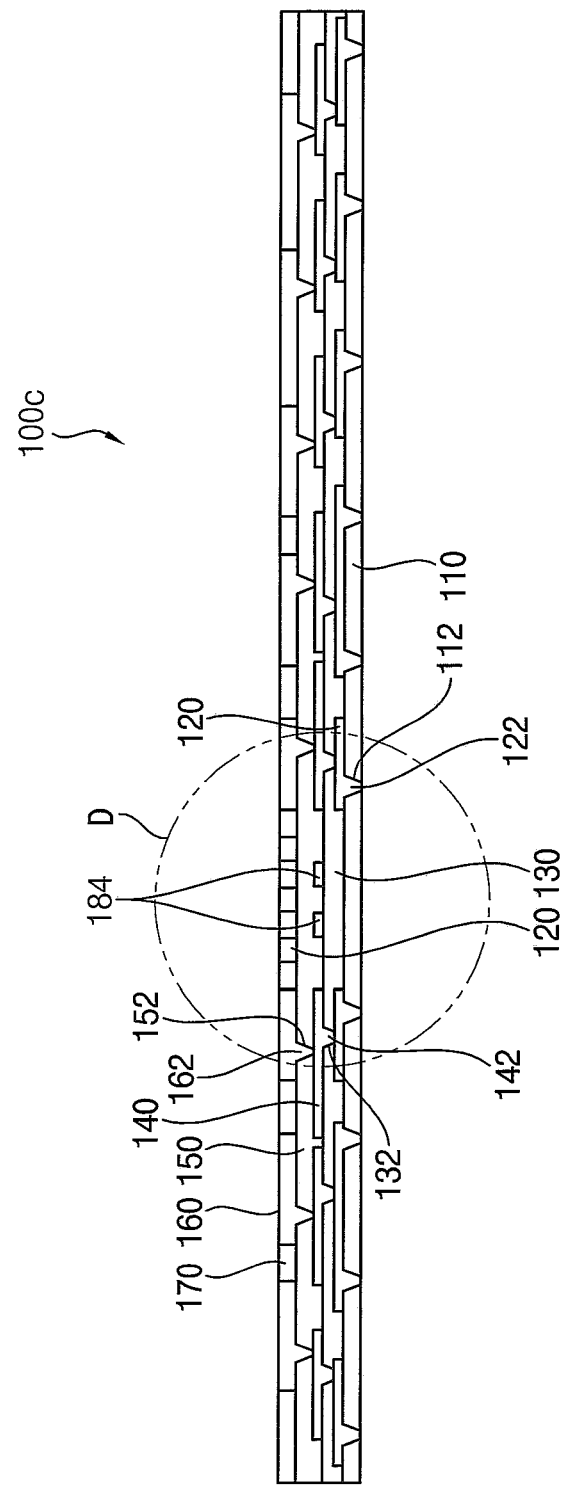
Figure 8:
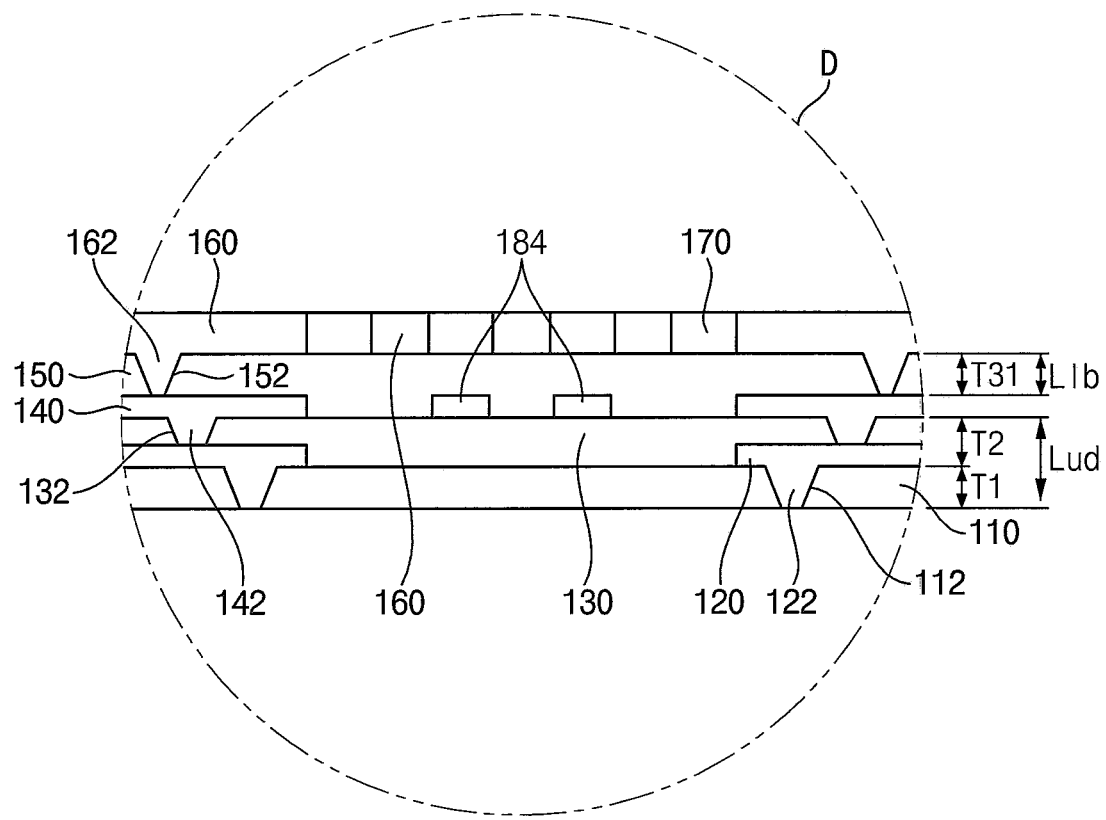

FIG. 7 is a cross-sectional view illustrating a package substrate in accordance with example embodiments, and FIG. 8 is an enlarged cross-sectional view of a portion "D" in FIG. 7.

A package substrate 100c of this example embodiment may include elements substantially the same as those of the package substrate 100X in FIG. 1 except for a position of impedance patterns. Thus, the same reference numerals may refer to the same elements and any further illustrations with respect to the same elements may be omitted herein for brevity.

Referring to FIGS. 7 and 8, a pair of impedance patterns 184 may be arranged on the upper surface of the second insulation layer 130. Lower surfaces of the pair of impedance patterns 184 may contact the upper surface of the second insulation layer 130. Particularly, the impedance patterns 184 may be positioned between the second RDLs 140. For example, the pair of impedance patterns 184 may horizontally overlap the second RDLs 140. The impedance patterns 184 may be formed together with the second RDLs 140. For example, the impedance patterns 184 may be a part of the second RDLs 140. Upper surfaces of the impedance patterns 184 and the second RDLs 140 may be coplanar. The impedance patterns 184 may be positioned in one level or at least two levels.

In example embodiments, a dummy conductive pattern, which may be to be arranged on a level on which the third RDLs 160 may be arranged, may not be arranged under the impedance patterns 184. Thus, only the first insulation layer 110 and only the second insulation layer 130 may exist under the impedance patterns 184. As mentioned above, because the first insulation layer 110 and the second insulation layer 130 may exist under the impedance patterns 184, a lower insulation length Lud of the impedance patterns 184 may be a summed length of the thickness T1 of the first insulation layer 110 and the thickness T2 of the second insulation layer 130. For example, when the first insulation layer 110 and the second insulation layer 130 may have a same thickness, the lower insulation length Lud of the impedance patterns 184 may be about two times the thickness of the first insulation layer 110 or the second insulation layer 130. Particularly, when the thickness of the first insulation layer 110 or the second insulation layer 130 may be about 5 μm to about 10 μm, the lower insulation length Lud of the impedance patterns 184 may be about 10 μm to about 20 μm.

In contrast, a dummy conductive pattern as a part of the third RDLs 160 may be arranged over the impedance patterns 184. Thus, an upper insulation length L1b of the impedance patterns 184 may be about the partial thickness T31 of the third insulation layer 150.

According to example embodiments, the lower insulation length Lud of the impedance patterns 184 on the upper surface of the second insulation layer 130 may be a summed length of the thickness T1 of the first insulation layer 110 and the thickness T2 of the second insulation layer 130. Thus, the thicknesses of the insulation layers may be reduced to provide the package substrate 100c with a thin thickness. Further, a warpage of the package substrate 100c may be readily controlled by reducing the thickness of the insulation layer.

Figure 9:
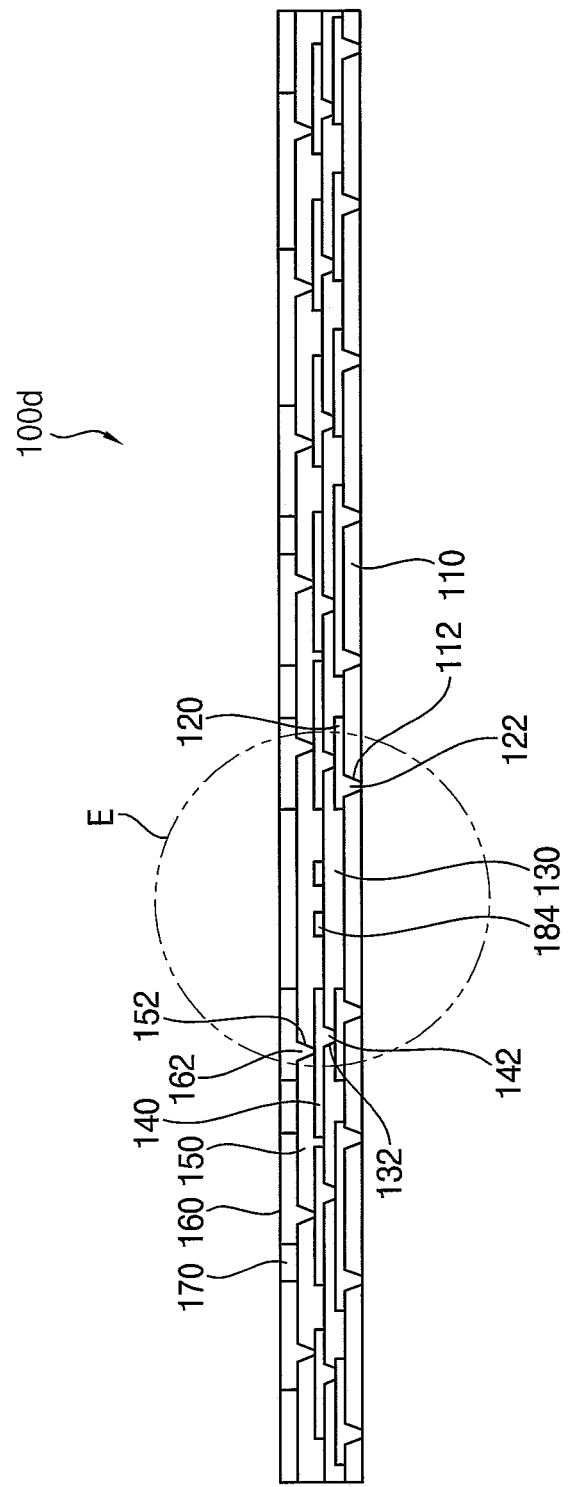
Figure 10:
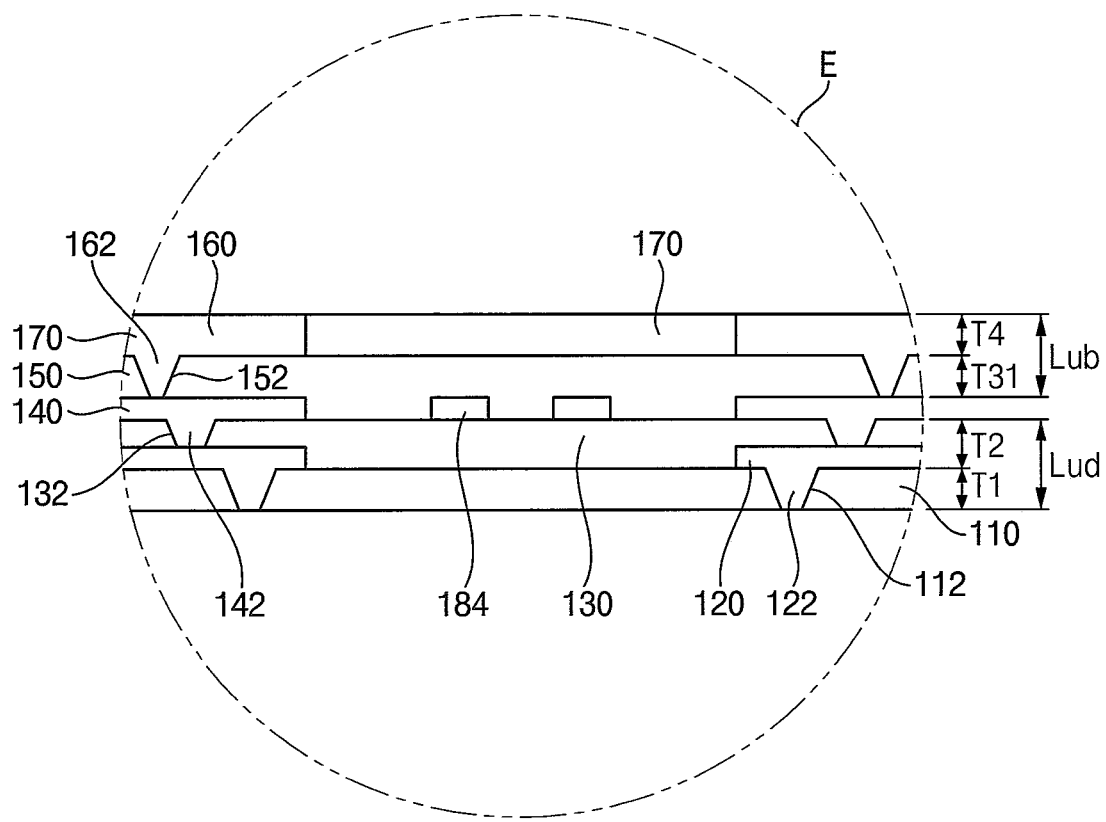

FIG. 9 is a cross-sectional view illustrating a package substrate in accordance with example embodiments, and FIG. 10 is an enlarged cross-sectional view of a portion "E" in FIG. 9.

A package substrate 100d of this example embodiment may include elements substantially the same as those of the package substrate 100 in FIG. 1 except for a position of impedance patterns. Thus, the same reference numerals may refer to the same elements and any further illustrations with respect to the same elements may be omitted herein for brevity.

Referring to FIGS. 9 and 10, a pair of impedance patterns 184 may be arranged on the upper surface of the second insulation layer 130. The pair of impedance patterns 184 may contact the upper surface of the second insulation layer 130. Particularly, the impedance patterns 184 may be positioned between the second RDLs 140. For example, the pair of impedance patterns 184 may horizontally overlap the second RDLs 140. The impedance patterns 184 may be formed together with the second RDLs 140. For example, the impedance patterns 184 may be a part of the second RDLs 140. Upper surfaces of the impedance patterns 184 and the second RDLs 140 may be coplanar. The impedance patterns 184 may be positioned in one level or at least two levels.

In example embodiments, a dummy conductive pattern, which may be to be arranged on a level on which the third RDLs 160 may be arranged, may not be arranged over the impedance patterns 184. Thus, only the third insulation layer 150 and the fourth insulation layer 170 may exist over the impedance patterns 184. As mentioned above, because the third insulation layer 150 and the fourth insulation layer 170 may exist over the impedance patterns 184, an upper insulation length Lub of the impedance patterns 184 may be a summed length of the partial thickness T31 of the third insulation layer 150 and the thickness T4 of the fourth insulation layer 170. The impedance patterns 184 may be positioned on the upper surface of the second insulation layer 130 so that the partial thickness T31 of the third insulation layer 150 may be a value by subtracting the thickness of the impedance pattern 184 from the total thickness T3 of the third insulation layer 150.

In example embodiments, a dummy conductive pattern, which may be to be arranged on a level on which the first RDLs 120 may be arranged, may not be arranged under the impedance patterns 184. Thus, only the first insulation layer 110 and the second insulation layer 130 may exist under the impedance patterns 184. As mentioned above, because the first insulation layer 110 and the second insulation layer 130 may exist under the impedance patterns 184, a lower upper insulation length Lud of the impedance patterns 184 may be a summed length of the thickness T1 of the first insulation layer 110 and the thickness T2 of the second insulation layer 130.

According to example embodiments, the impedance patterns 184 on the upper surface of the second insulation layer 130 may have the upper insulation length Lub of the impedance patterns 184 corresponding to the summed length of the partial thickness T31 of the third insulation layer 150 and the thickness T4 of the fourth insulation layer 170, and the lower insulation length Lud corresponding to the summed length of the thickness T1 of the first insulation layer 110 and the thickness T2 of the second insulation layer 130. Thus, the thicknesses of the insulation layers may be reduced to provide the package substrate 100d with a thin thickness. Further, a warpage of the package substrate 100*d* may be readily controlled by reducing the thickness of the insulation layer.

Figure 11:
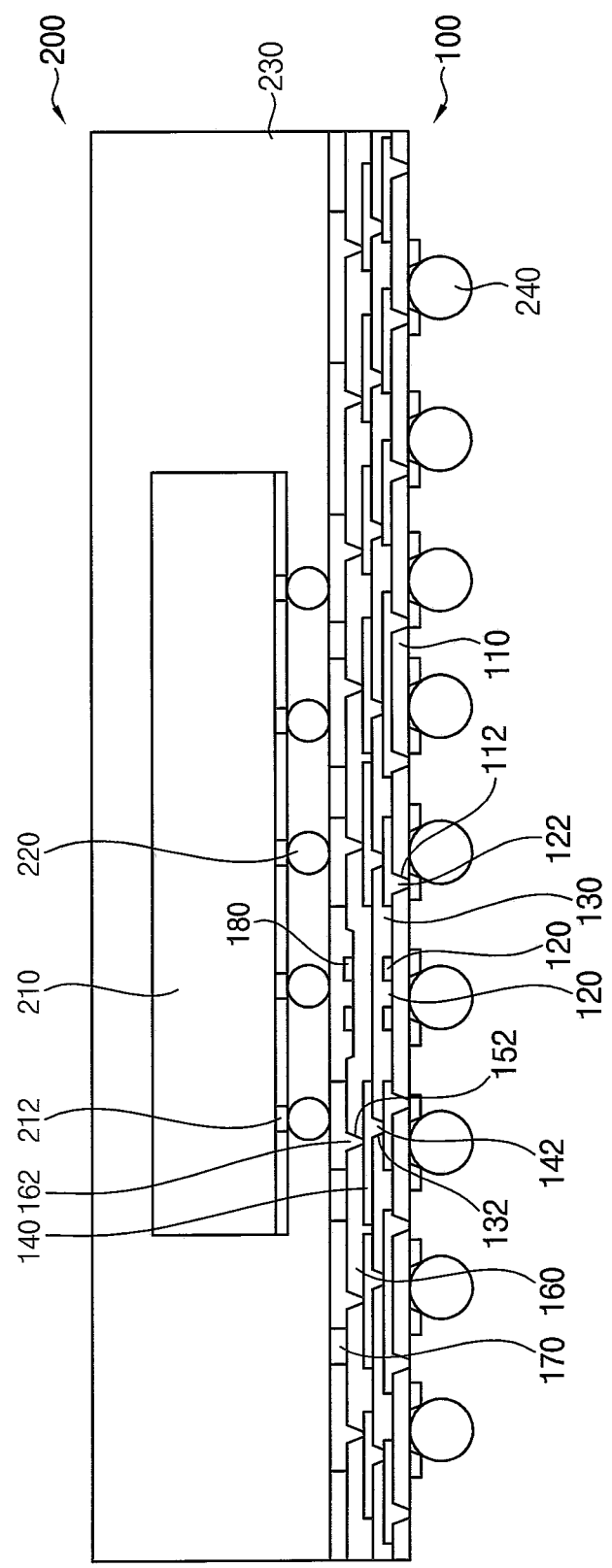

FIG. 11 is a cross-sectional view illustrating a semiconductor package in accordance with example embodiments.

Referring to FIG. 11, a semiconductor package 200 of this example embodiment may include a package substrate 100, a semiconductor chip 210, conductive bumps 220, a molding member 230, and external terminals 240.

In example embodiments, the package substrate 100 may include the package substrate 100 in FIG. 1. Alternatively, the semiconductor package 200 may include the package substrate 100*a* in FIG. 3, the package substrate 100*b* in FIG. 5, the package substrate 100*c* in FIG. 7, or the package substrate 100*d* in FIG. 9.

The semiconductor chip 210 may be arranged on the upper surface of the package substrate 100. The semiconductor chip 210 may include pads 212. The pads 212 may be arranged on a lower surface of the semiconductor chip 210. For example, the lower surface of the semiconductor chip 210 may correspond to an active face of the semiconductor chip 210. The pads 212 may be electrically connected with the package substrate 100 via the conductive bumps 220.

The molding member 230 may be formed on the upper surface of the package substrate 100 to cover the semiconductor chip 210. The molding member 230 may include an epoxy molding compound (EMC).

Figure 12:
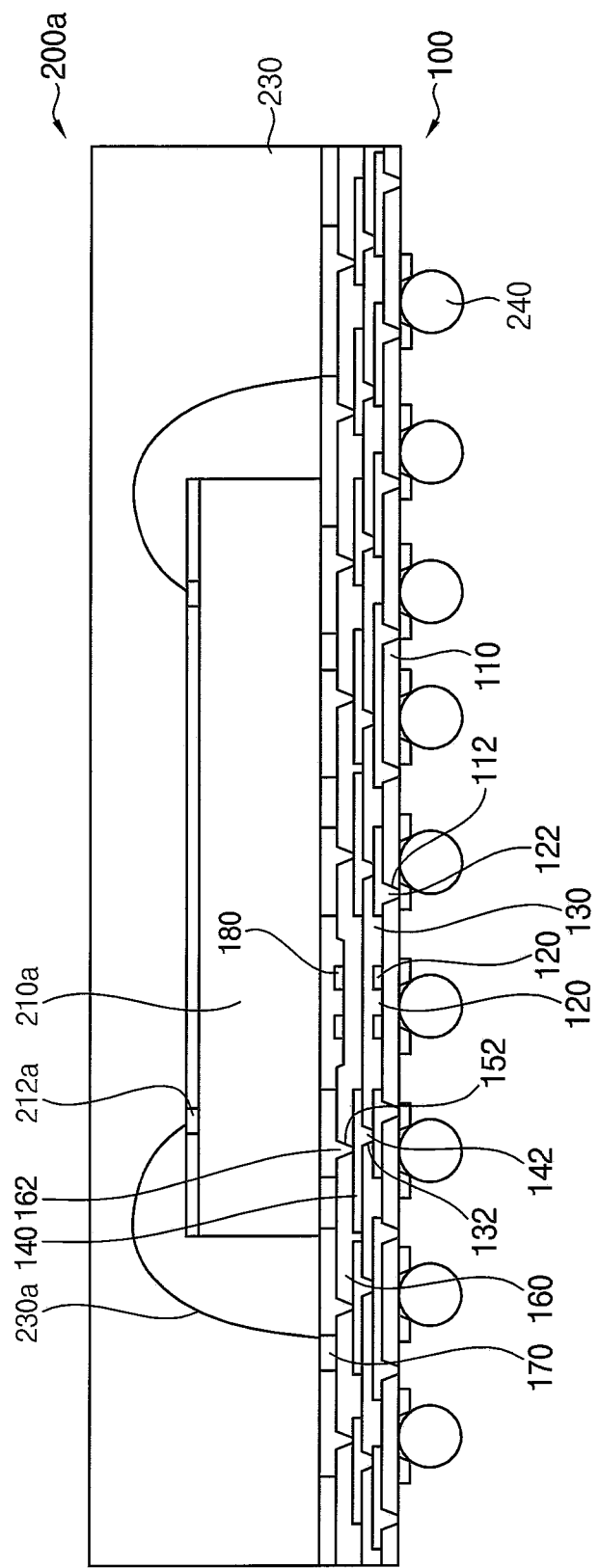

FIG. 12 is a cross-sectional view illustrating a semiconductor package in accordance with example embodiments.

A semiconductor package 200*a* of this example embodiment may include elements substantially the same as those of the semiconductor package 200 in FIG. 11 except for an electrical connection between a semiconductor chip and a package substrate. Thus, the same reference numerals may refer to the same elements and any further illustrations with respect to the same elements may be omitted herein for brevity.

Referring to FIG. 12, a semiconductor chip 210*a* of a semiconductor package 200*a* in accordance with example embodiments may have an upper surface corresponding to an active face of the semiconductor chip 210*a*. Thus, pads 212*a* may be arranged on the upper surface of the semiconductor chip 210*a*. Conductive wires 230*a* may be electrically connected between the pads 212*a* and the first RDLs 120 of the package substrate 100.

In example embodiments, the package substrate 100 may include the package substrate 100 in FIG. 1. Alternatively, the semiconductor package 200*a* may include the package substrate 100*a* in FIG. 3, the package substrate 100*b* in FIG. 5, the package substrate 100*c* in FIG. 7, or the package substrate 100*d* in FIG. 9.

Figure 13:
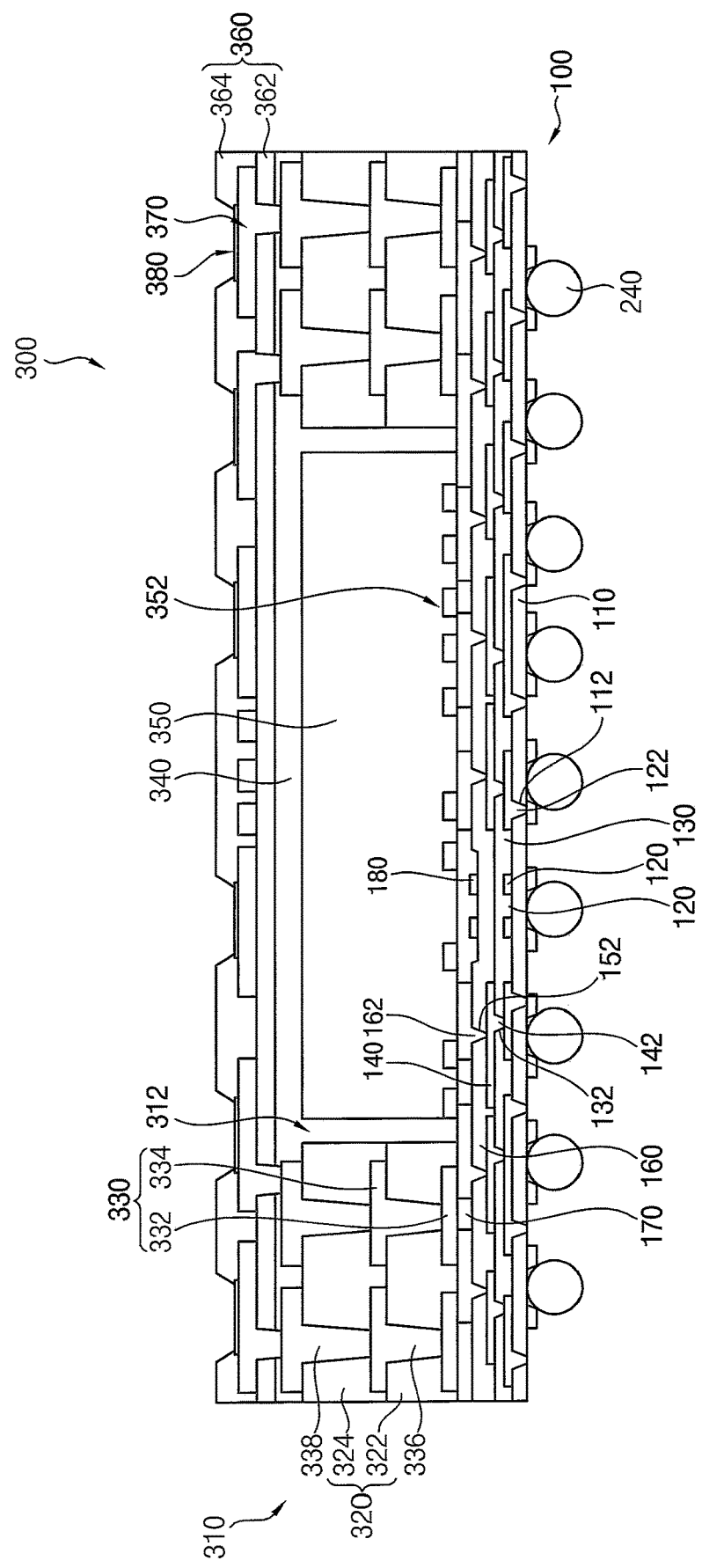

FIG. 13 is a cross-sectional view illustrating a fan-out type semiconductor package in accordance with example embodiments.

Referring to FIG. 13, a fan-out type semiconductor package 300 of this example embodiment may include a package substrate 100, a frame 310, a semiconductor chip 350, a molding member 340, an upper RDL 370, an upper insulation layer 360, and external terminals 380.

In example embodiments, the package substrate 100 may include the package substrate 100 in FIG. 1. Alternatively, the semiconductor package 300 may include the package substrate 100*a* in FIG. 3, the package substrate 100*b* in FIG. 5, the package substrate 100*c* in FIG. 7, or the package substrate 100*d* in FIG. 9.

The frame 310 may be arranged on the upper surface of the package substrate 100. The frame 310 may include an insulation substrate 320 and a middle RDL 330. The insulation substrate 320 may have a cavity 312. The cavity 312 may be vertically formed through a central portion of the insulation substrate 320. The middle RDL 330 may be formed in the insulation substrate 320.

The insulation substrate 320 may include a first insulation layer 322 and a second insulation layer 324. The first insulation layer 322 may have an opening vertically formed through the first insulation layer 322. The second insulation layer 324 may be formed on an upper surface of the first insulation layer 322. The second insulation layer 324 may have an opening vertically formed through the second insulation layer 324.

The middle RDL 330 may include a first middle RDL pattern 332 and a second middle RDL pattern 334. The first middle RDL pattern 332 may be formed on a lower surface of the first insulation layer 322. The second middle RDL pattern 334 may be formed on the upper surface of the first insulation layer 322. The opening of the first insulation layer 322 may be filled with a first contact 336. Thus, the first middle RDL pattern 332 and the second middle RDL pattern 334 may be electrically connected with each other via the first contact 336. The opening of the second insulation layer 324 may be filled with a second contact 338. The second contact 338 may be electrically connected to the second middle RDL pattern 334. An upper surface of the second contact 338 may be upwardly exposed.

The semiconductor chip 350 may be arranged in the cavity 312 of the insulation substrate 320. The semiconductor chip 350 may include a plurality of pads 352. The pads 352 may be arranged on a lower surface of the semiconductor chip 350. The semiconductor chip 350 may have an upper surface substantially coplanar with the upper surface of the insulation substrate 320. Alternatively, the upper surface of the semiconductor chip 350 may be positioned over or under the upper surface of the insulation substrate 320.

The molding member 340 may function as to mold the semiconductor chip 350. In example embodiments, the molding member 340 may be formed on the upper surface of the insulation substrate 320 to fill a space between the semiconductor chip 350 and an inner surface of the cavity 312.

The upper insulation layer 360 may be formed on an upper surface of the molding member 340. In example embodiments, the upper insulation layer 360 may include PID. However, the upper insulation layer 340 may include other insulation materials besides the PID.

The upper insulation layer 360 may include a first insulation layer 362 and a second insulation layer 364. The first insulation layer 362 may be formed on the upper surface of the molding member 340. The first insulation layer 362 may have an opening configured to expose the second middle RDL pattern 334.

The upper RDL 370 may be formed on an upper surface of the first insulation layer 362 to fill the opening of the first insulation layer 362. Thus, the upper RDL 370 may be electrically connected to the second middle RDL pattern 334.

The second insulation layer 364 may be formed on the upper surface of the first insulation layer 362. The second insulation layer 364 may have an opening configured to expose the upper RDL 370.

Additionally, although not illustrated, a second semiconductor chip may be arranged on the upper surface of the second insulation layer 364. Conductive bumps of the second semiconductor chip may be arranged in the openings of the second insulation layer 364 to electrically connect the second semiconductor chip with the upper RDL 370 via the conductive bumps.

Figure 14:
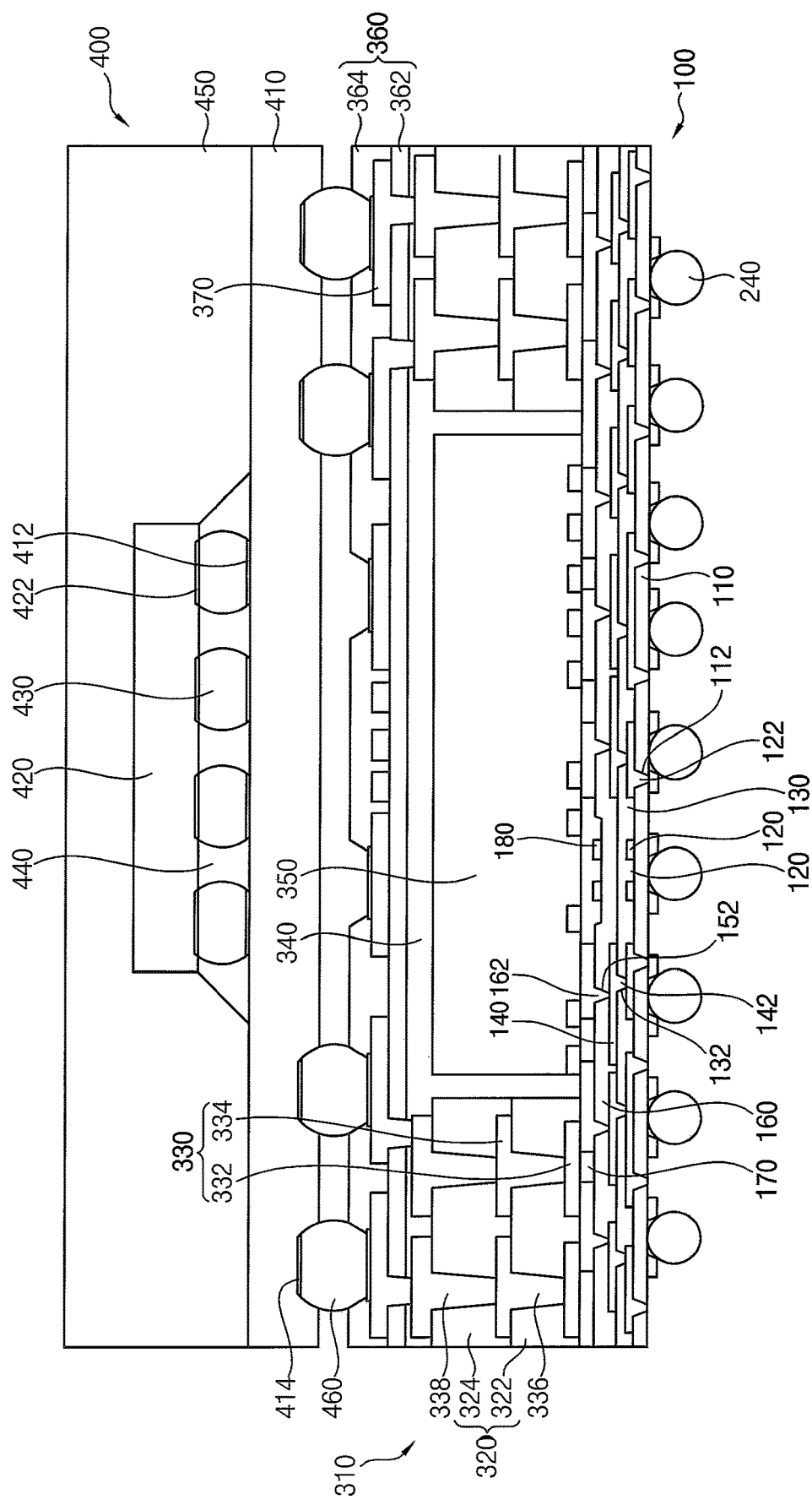

FIG. 14 is a cross-sectional view illustrating a semiconductor package in accordance with example embodiments.

A semiconductor package 400 of this example embodiment may include elements substantially the same as those of the semiconductor package 300 in FIG. 13 except for further including a second semiconductor package. Thus, the same reference numerals may refer to the same elements and any further illustrations with respect to the same elements may be omitted herein for brevity.

Referring to FIG. 14, a semiconductor package 400 of this example embodiment may further include a second semiconductor package stacked on the semiconductor package 300 in FIG. 18. For example, the semiconductor package 400 of this example embodiment may have a package-on-package (POP) structure.

The second semiconductor package may include a package substrate 410, a second semiconductor chip 420, conductive bumps 430, an underfilling layer 440, and a molding member 450.

The package substrate 410 may be electrically connected with the semiconductor package 300 in FIG. 18 via the conductive bumps 460 such as solder balls. For example, the conductive bumps 460 may be mounted on the upper RDL 370 of the semiconductor package 300 in FIG. 13. A lower surface of the package substrate 410 may be electrically connected with the upper RDL 370 of the semiconductor package 300 via the conductive bumps 460.

The package substrate 410 may include a plurality of lower pads 414 and a plurality of upper pads 412. The lower pads 414 may be arranged on the lower surface of the package substrate 410 to electrically make contact with the conductive bumps 460. The upper pads 412 may be arranged on the upper surface of the package substrate 410.

The second semiconductor chip 420 may be arranged over the package substrate 410. The second semiconductor chip 420 may include a plurality of pads 422. The pads 422 may be arranged on a lower surface of the second semiconductor chip 420.

The conductive bumps 430 may be interposed between the package substrate 410 and the second semiconductor chip 420. Particularly, the conductive bumps 430 may be electrically connected between the upper pads 412 of the package substrate 410 and the pads 422 of the second semiconductor chip 420.

The underfilling layer 440 may be interposed between the package substrate 410 and the second semiconductor chip 420 to surround the conductive bumps 430. The underfilling layer 440 may include an insulation material such as epoxy resin.

The molding member 450 may be formed on the upper surface of the molding member 410 to cover the second semiconductor chip 420. The molding member 450 may include an epoxy molding compound (EMC).

Figure 15:
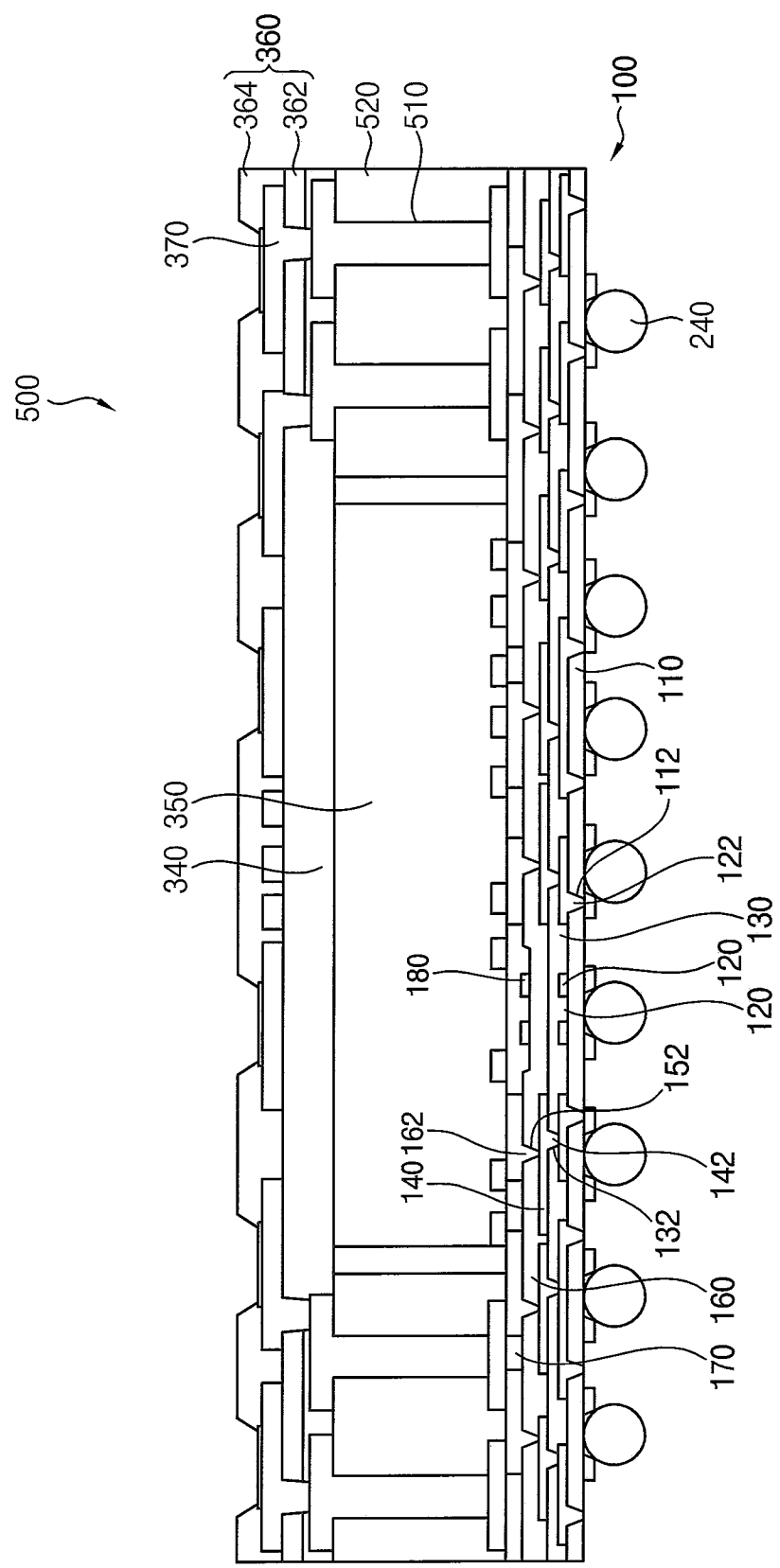

FIG. 15 is a cross-sectional view illustrating a semiconductor package in accordance with example embodiments.

Referring to FIG. 15, a semiconductor package 500 of this example embodiment may include a fan-out type wafer level package. Thus, the semiconductor package 500 of this example embodiment may include a package substrate 100, a semiconductor chip 350, a molding member 520, a conductive post 510, an upper RDL 370, an upper insulation layer 360, and external terminals 380.

In example embodiments, the package substrate 100 may include the package substrate 100 in FIG. 1. Alternatively, the semiconductor package 500 may include the package substrate 100a in FIG. 3, the package substrate 100b in FIG. 5, the package substrate 100c in FIG. 7, or the package substrate 100d in FIG. 9.

The molding member 520 may be formed on the upper surface of the lower redistribution structure to surround side surfaces of the semiconductor chip 350. The molding member 520 may correspond to a part of a wafer.

The conductive post 510 may be vertically formed through the molding member 520. A lower end of the conductive post 510 may be electrically connected to the package substrate 100. Particularly, the lower end of the post 510 may be electrically connected to the first RDL 122. The post 510 may include a metal such as copper.

The upper insulation layer 360 and the upper RDL 370 may have structures substantially the same as those in FIG. 13, respectively. Thus, any further illustrations with respect to the upper insulation layer 360 and the upper RDL 370 may be omitted herein for brevity. An upper end of the post 520 may be electrically connected to the upper RDL 370.

According to example embodiments, a dummy conductive pattern may not be arranged between the impedance patterns and the RDL. Thus, only the insulation layer may exist between the impedance patterns and the RDL. Therefore, the insulation length of the impedance patterns may correspond to the summed length of the thicknesses of the at least two insulation layers. As a result, the package substrate may have a thin thickness by decreasing the thickness of the insulation layer. Further, the warpage of the package may be readily controlled by decreasing the thickness of the insulation layer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor package comprising:
a package substrate including a first insulation layer, first redistribution layers (RDL), a second insulation layer, second RDLs, a third insulation layer, third RDLs, a pair of impedance patterns, and a fourth insulation layer, the first insulation layer including a plurality of first via holes, the first RDLs arranged on an upper surface of the first insulation layer to fill the first via holes, the second insulation layer arranged on an upper surface of the first insulation layer and including a plurality of second via holes configured to expose the first RDLs, the second RDLs arranged on an upper surface of the second insulation layer and in the second via holes to be electrically connected with the first RDLs, the third insulation layer arranged on an upper surface of the second insulation layer and having a plurality of third via holes configured to expose the second RDLs, the third RDLs arranged on an upper surface of the third insulation layer and in the third via holes to be electrically connected with the second RDLs, the pair of impedance patterns arranged on the upper surface of the third insulation layer over the second RDLs, the pair of impedance patterns having an insulation length corresponding to a summed length of a thickness of the second insulation layer and a thickness of the third insulation layer, and the fourth insulation layer arranged on the upper surface of the third insulation layer to surround the third RDLs and the impedance patterns;

a semiconductor chip arranged on an upper surface of the package substrate and electrically connected with the third RDLs;

a molding member arranged on the upper surface of the package substrate to surround the semiconductor chip; and external terminals arranged on a lower surface of the package substrate and electrically connected with the first RDLs, wherein the pair of impedance patterns are positioned on a horizontal plane under a horizontal plane on which the third RDLs are placed.

2. The semiconductor package of claim 1, wherein the insulation length is a summed length of the thickness of the second insulation layer and the thickness of the third insulation layer between a lower surface of the impedance patterns and an upper surface of the first RDLs.

3. The semiconductor package of claim 1, wherein the impedance patterns have a lower surface positioned lower than a lower surface of the third RDLs.

4. The semiconductor package of claim 1, wherein the fourth insulation layer is configured to cover an upper surface of the impedance patterns.

5. The semiconductor package of claim 1, further comprising:
a frame having a cavity configured to receive the semiconductor chip,
wherein the molding member is arranged on an upper surface of the frame to fill a space between an inner surface of the cavity and the semiconductor chip.

6. The semiconductor package of claim 5, wherein the frame comprises a middle RDL.

7. The semiconductor package of claim 6, further comprising:
an upper insulation layer arranged on an upper surface of the molding member; and
an upper RDL arranged on the upper insulation layer and electrically connected with the middle RDL.

8. The semiconductor package of claim 1,
wherein the molding member is configured to surround side surfaces of the semiconductor chip, and
wherein conductive posts electrically connected to the third RDLs are arranged in the molding member.

9. A package substrate comprising:
a first insulation layer including a plurality of first via holes;
first redistribution layers (RDLs) arranged on an upper surface of the first insulation layer to fill the first via holes;
a second insulation layer arranged on an upper surface of the first insulation layer, the second insulation layer including a plurality of second via holes configured to expose the first RDLs;
second RDLs arranged on an upper surface of the second insulation layer and in the second via holes to be electrically connected with the first RDLs;
a third insulation layer arranged on an upper surface of the second insulation layer and having a plurality of third via holes configured to expose the second RDLs;
third RDLs arranged on an upper surface of the third insulation layer and in the third via holes to be electrically connected with the second RDLs;
a pair of impedance patterns arranged on the upper surface of the third insulation layer over the second RDLs, the pair of impedance patterns arranged on at least one level to have an insulation length corresponding to a summed length of a thickness of the second insulation layer and a thickness of the third insulation layer; and
a fourth insulation layer arranged on the upper surface of the third insulation layer to surround the third RDLs and the pair of impedance patterns,
wherein the insulation length is the summed length of the thickness of the second insulation layer and the thickness of the third insulation layer between a lower surface of the pair of impedance patterns and an upper surface of the first RDLs.

10. The package substrate of claim 9, wherein the pair of impedance patterns are positioned on a horizontal plane under a horizontal plane on which the third RDLs are placed.

11. A package substrate comprising:
a plurality of insulation layers sequentially stacked;
a plurality of redistribution layers (RDLs) arranged between the insulation layers; and
a pair of impedance patterns arranged on an upper surface of at least one insulation layer among the plurality of insulation layers, the pair of impedance patterns arranged on at least one level to have an insulation length corresponding to a summed length of thicknesses of at least two insulation layers among the plurality of the insulation layers,
wherein lower surfaces of the pair of impedance patterns are positioned on a horizontal plane lower than a horizontal plane of an uppermost portion of the upper surface of the at least one insulation layer.

12. The package substrate of claim 11, wherein the insulation layers comprise:
a first insulation layer;
a second insulation layer arranged on an upper surface of the first insulation layer;
a third insulation layer arranged on an upper surface of the second insulation layer; and
a fourth insulation layer arranged on the upper surface of the third insulation layer, and
wherein the plurality of RDLs comprise:
first RDLs arranged on an upper surface of the first insulation layer;
second RDLs arranged on an upper surface of the second insulation layer and electrically connected with the first RDLs; and
third RDLs arranged on an upper surface of the third insulation layer and electrically connected with the second RDLs.

13. The package substrate of claim 12, wherein the impedance patterns are arranged on the upper surface of the third insulation layer between the second RDLs.

14. The package substrate of claim 13, wherein the insulation length corresponds to a summed length of a thickness of the second insulation layer and a thickness of the third insulation layer.

15. The package substrate of claim 12, wherein the impedance patterns are arranged on the upper surface of the first insulation layer between the second RDLs.

16. The package substrate of claim 15, wherein the insulation length corresponds to a summed length of a thickness of the second insulation layer and a thickness of the third insulation layer.

17. The package substrate of claim 12, wherein the impedance patterns are arranged on the upper surface of the second insulation layer between the second RDLs.

18. The package substrate of claim 17, wherein the insulation length corresponds to a summed length of a thickness of the first insulation layer and a thickness of the second insulation layer or a summed length of a thickness of the third insulation layer and a thickness of the fourth insulation layer.

* * * * *